United States Patent
Pan

(10) Patent No.: US 7,603,098 B2
(45) Date of Patent: Oct. 13, 2009

(54) PROGRAMMABLE IF FREQUENCY FILTER FOR ENABLING A COMPROMISE BETWEEN DC OFFSET REJECTION AND IMAGE REJECTION

(75) Inventor: Meng-An Pan, Cerritos, CA (US)

(73) Assignee: Broadcom Corporation, Irvine, CA (US)

( * ) Notice: Subject to any disclaimer, the term of this patent is extended or adjusted under 35 U.S.C. 154(b) by 835 days.

(21) Appl. No.: 10/813,270

(22) Filed: Mar. 31, 2004

(65) Prior Publication Data

US 2005/0221783 A1   Oct. 6, 2005

(51) Int. Cl.
*H04B 1/10* (2006.01)
(52) U.S. Cl. ............. 455/302; 455/334; 455/240.1; 327/355
(58) Field of Classification Search ........... 455/205, 455/208, 209, 213, 313, 323, 324, 338–341, 455/296, 302, 334, 234.1, 240.1, 250.1; 327/352, 327/354, 355
See application file for complete search history.

(56) References Cited

U.S. PATENT DOCUMENTS

| | | | |
|---|---|---|---|
| 4,724,407 A | 2/1988 | Miura et al. | |
| 4,857,778 A | 8/1989 | Hague | |
| 4,866,779 A | 9/1989 | Kennedy et al. | |
| 4,914,408 A | 4/1990 | Voorman | |
| 4,928,315 A | 5/1990 | Jensen et al. | |
| 4,965,853 A | 10/1990 | Barnard | |
| 5,028,893 A | 7/1991 | Marrah et al. | |
| 5,140,703 A * | 8/1992 | Payne | 455/226.1 |
| 5,285,502 A | 2/1994 | Walton et al. | |
| 5,307,372 A * | 4/1994 | Sawyer et al. | 375/133 |
| 5,535,283 A | 7/1996 | Saruta et al. | |
| 5,629,655 A | 5/1997 | Dent | |
| 5,726,974 A * | 3/1998 | Kunieda et al. | 370/206 |
| 5,933,448 A * | 8/1999 | Katisko | 375/219 |
| 6,055,282 A * | 4/2000 | Hughes et al. | 375/340 |
| 6,370,370 B1 | 4/2002 | Roth et al. | |
| 6,437,639 B1 | 8/2002 | Nguyen et al. | |
| 6,441,682 B1 * | 8/2002 | Vinn et al. | 327/552 |
| 6,445,735 B1 | 9/2002 | Whikehart | |
| 6,559,740 B1 | 5/2003 | Schulz | |
| 6,577,855 B1 | 6/2003 | Moore et al. | |
| 6,633,550 B1 | 10/2003 | Gardenfors et al. | |
| 6,892,060 B2 | 5/2005 | Zheng | |
| 6,917,252 B1 | 7/2005 | Wyszynski | |
| 7,050,778 B1 * | 5/2006 | Olson | 455/296 |
| 7,098,731 B1 | 8/2006 | Wyszynski | |
| 7,120,416 B2 * | 10/2006 | Tomita | 455/340 |
| 7,138,873 B2 | 11/2006 | Chandra et al. | |
| 7,171,185 B2 * | 1/2007 | Matsumoto et al. | 455/324 |
| 7,376,409 B2 | 5/2008 | Pan | |
| 2001/0001759 A1 * | 5/2001 | Holden et al. | 455/266 |
| 2002/0071173 A1 | 6/2002 | Lee et al. | |
| 2002/0094037 A1 * | 7/2002 | Darabi et al. | 375/316 |
| 2002/0115420 A1 | 8/2002 | Cheng | |
| 2003/0016761 A1 * | 1/2003 | Min | 375/298 |
| 2003/0017817 A1 * | 1/2003 | Cowley | 455/323 |
| 2003/0064695 A1 | 4/2003 | Shi | |

(Continued)

FOREIGN PATENT DOCUMENTS

DE    32 23 904 A1    12/1983

(Continued)

*Primary Examiner*—Nhan T Le
(74) *Attorney, Agent, or Firm*—Sterne, Kessler, Goldstein & Fox P.L.L.C.

(57) ABSTRACT

The invention enables a compromise between DC offset rejection and image rejection through the use of a bandpass filter having a variable center frequency.

9 Claims, 4 Drawing Sheets

U.S. PATENT DOCUMENTS

| | | |
|---|---|---|
| 2003/0165203 A1* | 9/2003 | Mohindra .................. 375/324 |
| 2004/0002311 A1* | 1/2004 | Feng ....................... 455/194.2 |
| 2004/0247132 A1 | 12/2004 | Klayman et al. |
| 2004/0266369 A1 | 12/2004 | McCallister |
| 2005/0118975 A1 | 6/2005 | Ismail |
| 2005/0220223 A1 | 10/2005 | Pan |
| 2005/0221788 A1 | 10/2005 | Pan |
| 2005/0221789 A1 | 10/2005 | Pan |
| 2006/0153403 A1 | 7/2006 | Lechner |

FOREIGN PATENT DOCUMENTS

| | | |
|---|---|---|
| EP | 0 542 520 A2 | 5/1993 |
| EP | 0 797 292 A1 | 9/1997 |
| EP | 0 948 128 A1 | 10/1999 |

* cited by examiner

Improved DC Offset Rejection

Improved Image Rejection

PROGRAMMABLE IF FREQUENCY FILTER FOR ENABLING A COMPROMISE BETWEEN DC OFFSET REJECTION AND IMAGE REJECTION

BACKGROUND

1. Technical Field

This invention relates generally to wireless communication systems, and more particularly, but not exclusively, to a programmable IF frequency filter that enables a compromise between DC offset rejection and image rejection.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

However, two issues complicate the selection of an RF receiver IF frequency: DC offset rejection and image rejection. Increasing the IF frequency will improve DC offset rejection while decreasing the IF frequency will improve image rejection.

Accordingly, a new circuit and method is required that enables a compromise between DC offset rejection and image rejection.

SUMMARY

Embodiments of the invention enable a compromise between DC offset rejection and image rejection through the use of a bandpass filter having a variable center frequency.

In an embodiment of the invention, a method comprises: filtering a signal with a bandpass filter; measuring image rejection and DC offset rejection of the filtered signal; and adjusting a center frequency of the bandpass filter.

In an embodiment of the invention, a system (e.g., circuit) comprises a bandpass filter capable of filtering a received signal and capable of having a center frequency adjusted; and at least one measurement circuit, communicatively coupled to the filter, capable of measuring image rejection and DC offset rejection of the filtered signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
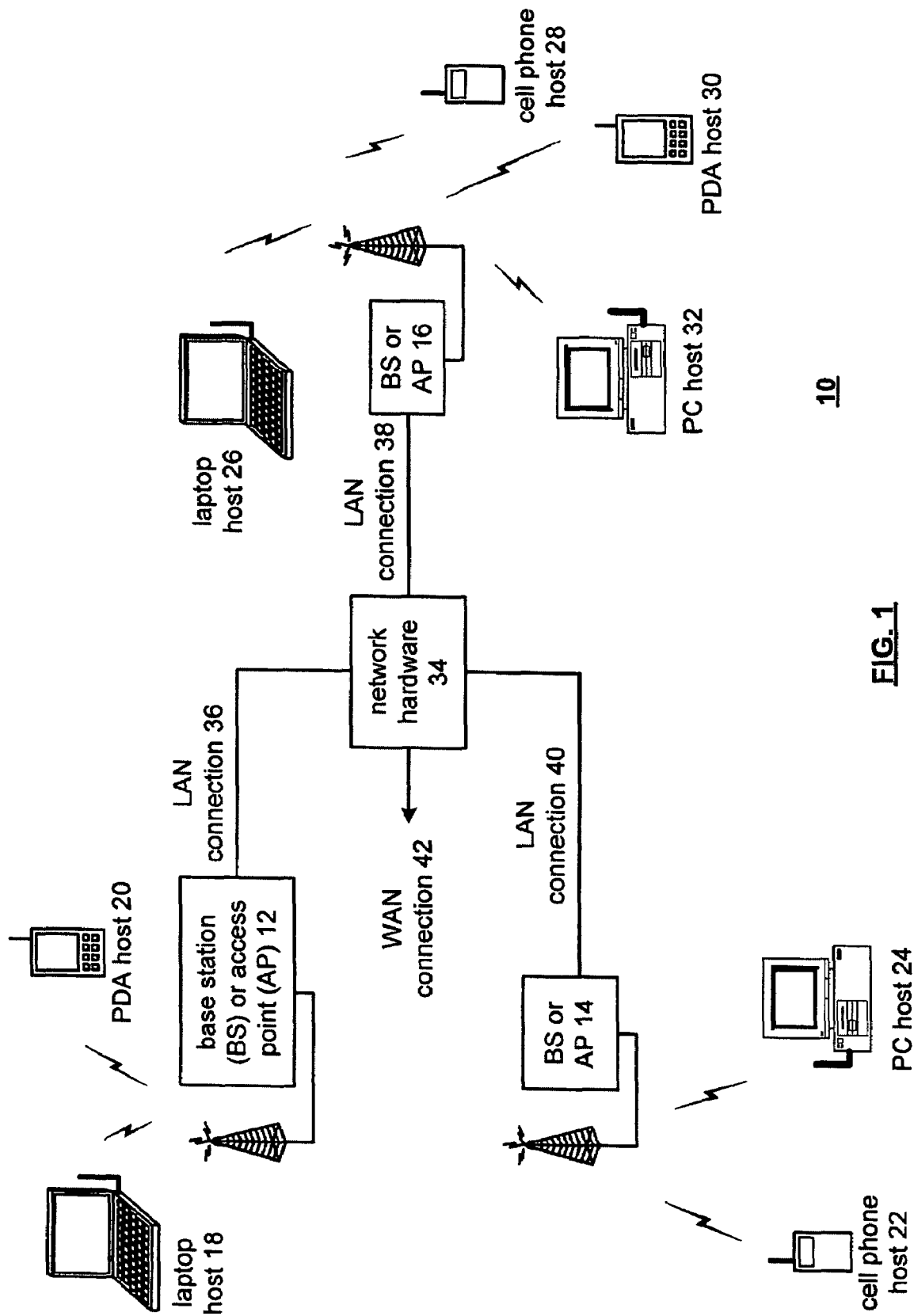
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power and therefore has characteristics of reduced power requirements, thereby extending the life of an associated power supply.

Figure 2:
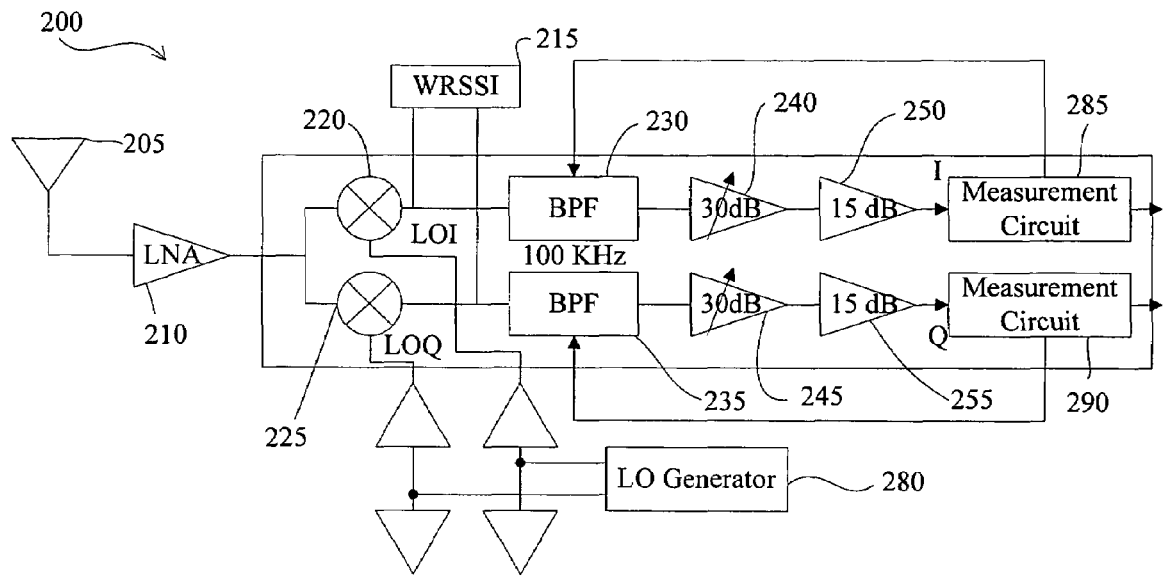
FIG. 2 is a circuit diagram illustrating a receiver.

FIG. 2 is a circuit diagram illustrating a receiver 200 with low-intermediate frequency, which is 100 KHz in this embodiment. An antenna 205 is coupled to a low noise amplifier (LNA) 210, which is coupled to down converters (mixers) 220 and 225. The down converters 220 and 225 are coupled to bandpass filters (BPFs) 230 and 235, respectively, which are coupled to programmable gain stages 240 and 245, respectively. The gain stages 240 and 245 are coupled to gain stages 250 and 255 respectively, which output analog signals to measurement circuits 285 and 290, respectively. Further, an LO generator 280 is coupled to to the down converters 220 and 225. A wideband radio signal strength indicator (WRSSI) 215 is coupled to connections between the down converters 220 and 225 and the bandpass filters 230 and 235.

The antenna 205 receives signals and passes the signals to the LNA 210, which amplifies the received signals and passes them to the down converters 220 and 225, which shifts the frequency of the received signals downwards. The BPFs 230 and 235 discriminate against unwanted frequencies outside of a selected band. The BPFs 230 and 235 also perform channel selection to compromise between image rejection and DC offset rejection, as will be discussed in further detail below.

In an embodiment of the invention, each BPF 230 and 235 can comprise 3 biquads with configurations as shown in Table I below.

TABLE I (Center Frequency of 100 KHz)

|  | Biquad1 | Biquad2 | Biquad3 |
|---|---|---|---|
| Center Frequency | 100 KHz | 186 KHz | 13.4 KHz |
| BW | 200 KHz | 100 KHz | 100 KHz |
| Q | 0.5 | 1.866 | 0.134 |
| Gain Setting | 20 dB, 0 dB | 10 dB, 0 dB | 0 dB |
| 30 dB | 20 dB | 10 dB | 0 dB |
| 20 dB | 20 dB | 0 dB | 0 dB |
| 10 dB | 0 dB | 10 dB | 0 dB |
| 0 dB | 0 dB | 0 dB | 0 dB |
| Current | 1.7 mA (I and Q) | 1.7 mA (I and Q) | 1.7 mA (I and Q) |

Each BPF 230 and 235 can have gain settings of 30 dB, 20 dB, 10 dB and 0 dB. IF can be centered at 112 KHz, 108 KHz, 104 KHz, and 100 KHz. Further, the BPFs 230 and 235 can change the IQ polarity.

Control words will vary the coupling resistor 410 values, which is Rx in FIG. 4, and change the IF frequency of the channel select filter 400. Control words for changing the channel selection (frequency selection) of the BPFs 230 and 235 are shown in Tables II below.

TABLE II

| BPF Center Frequency | Center Frequency Control Word (4 bit) |
|---|---|
| 112 KHz | 1000 |
| 108 KHz | 0100 |
| 104 KHz | 0010 |
| 100 KHz | 0001 |

The LO generator 280 determines how to bring an incoming RF signal received at the antenna 205 down to 100 KHz. The gain stages 240-255 increase the gain of the BPFs 230 and 235 output. The measurement circuits 285 and 290 measure the DC offset rejection and image rejection of the filtered signals and provide feedback to the BPFs 230 and 235 so that a new IF frequency can be chosen to form a better compromise between DC offset rejection and image rejection.

Figure 3:
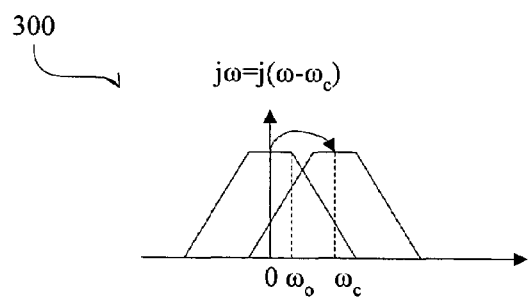
FIG. 3 is a chart illustrating an IF frequency shift to transform a low pass filter into a bandpass filter.

FIG. 3 is a chart illustrating an IF frequency shift 300 to transform a low pass filter into a bandpass filter. The transformation can be done by the variation of resistance in the BPFs 230 and 235 as derived below based on the circuits shown in FIG. 4A and FIG. 4B below. The transformation also enables IF frequency shifting to compensate for DC offset rejection and image rejection.

For a low pass filter:

$$\frac{y}{x} = \frac{\text{Gain}}{1 + j\frac{\omega}{\omega_0}},$$

wherein $\omega_o$ is the corner frequency.

For a bandpass filter:

$$\frac{y}{x} = \frac{\text{Gain}}{1 + j\frac{(\omega - \omega_c)}{\omega_0}},$$

wherein $\omega_c$ is the center frequency.

Therefore, for the channel select filter electrical equivalent 420 (FIG. 4B):

$$\frac{y}{x} = \frac{1}{j\frac{W}{W_0} + 1 - j2Q}$$

= Error! Objects cannot be created from editing field codes.

$$= \frac{1}{1 + j\left(\frac{\omega}{\omega_o} - 2Q\right)}$$

$$= \frac{1}{1 + j\frac{\omega - 2Q\omega_o}{\omega_o}}$$

-continued $$= \frac{1}{1 + j\frac{\omega - \omega_c}{\omega_o}}$$

Therefore, $$\omega_o = \frac{1}{R_f C}$$

$$\omega_c = \frac{1}{R_x C}$$

$$Q = \frac{\omega_c}{2\omega_o}$$

Figure 4A:
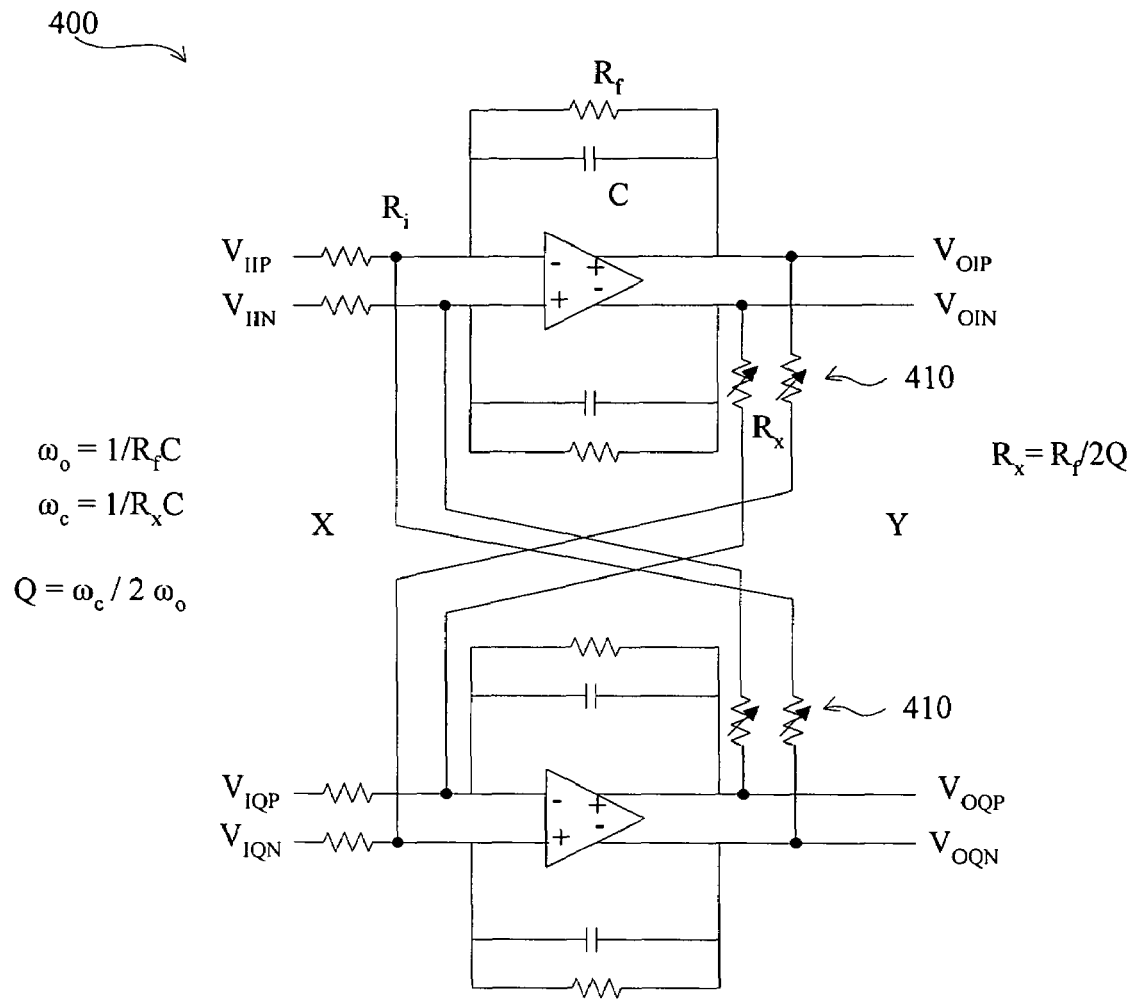
FIGS. 4A and 4B are diagrams illustrating a channel select filter (bandpass filter) of the receiver IF section of FIG. 2 and its electrical equivalent, respectively.
Figure 4B:
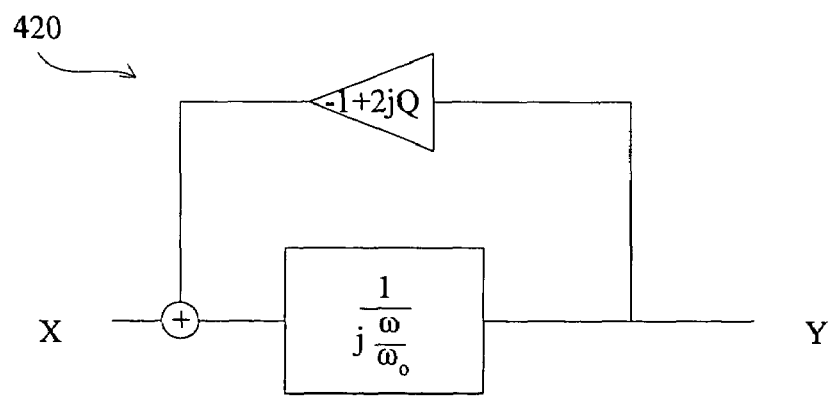

FIG. 4A and FIG. 4B are diagrams illustrating a channel select filter 400 (e.g., bandpass filters 230 and 235) and its electrical equivalent, respectively. The filter 400 is an active RC filter that enables achievement of a high dynamic range. The filter 400 comprises two cross coupled low pass filters having cross coupled variable resistors 410, each having a resistance $R_x$. As derived above, variation of $R_x$ shifts the bandpass filter IF frequency up or down. Specifically, the IF frequency of the filter 400 is inversely proportional to $R_x$.

During operation of the filter 400, a signal is filtered by the filter 400 with the resistors 410 set to an initial default value. The filtered signals are then transmitted to the measurement circuits 285 and 290 where image rejection and DC offset rejection are measured. The circuits 285 and 290 provide feedback to the resistors 410, which are then adjusted and the measurements repeated after filtering again. This process is repeated until a compromise is established between DC offset rejection and image rejection (e.g., wherein image rejection meets minimum pre-specified requirements and the DC offset rejection is within acceptable tolerances.).

Figure 5A:
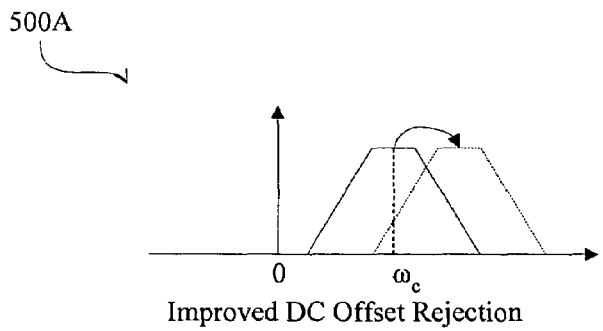
FIG. 5A and FIG. 5B are charts illustrating shifting the IF frequency of the channel select filter (bandpass filter) to overcome DC offset rejection and image rejection, respectively.
Figure 5B:
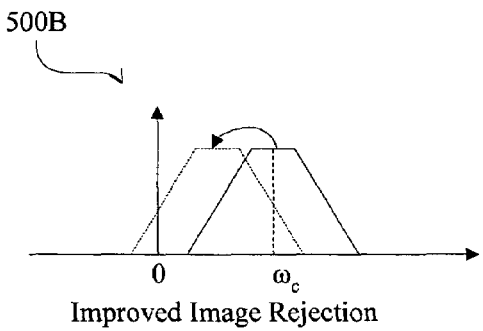

FIG. 5A and FIG. 5B are charts 500A and 500B illustrating shifting the IF frequency of the channel select filter 400 (e.g., bandpass filters 230 and 235) to overcome DC offset rejection and image rejection, respectively. During the operation of the filter 400, the IF frequency of the filter 400 is shifted upwards to improve DC offset rejection (as shown in FIG. 5A) and downwards to improve image rejection (as shown in FIG. 5B) until a compromise is reached.

Figure 6:
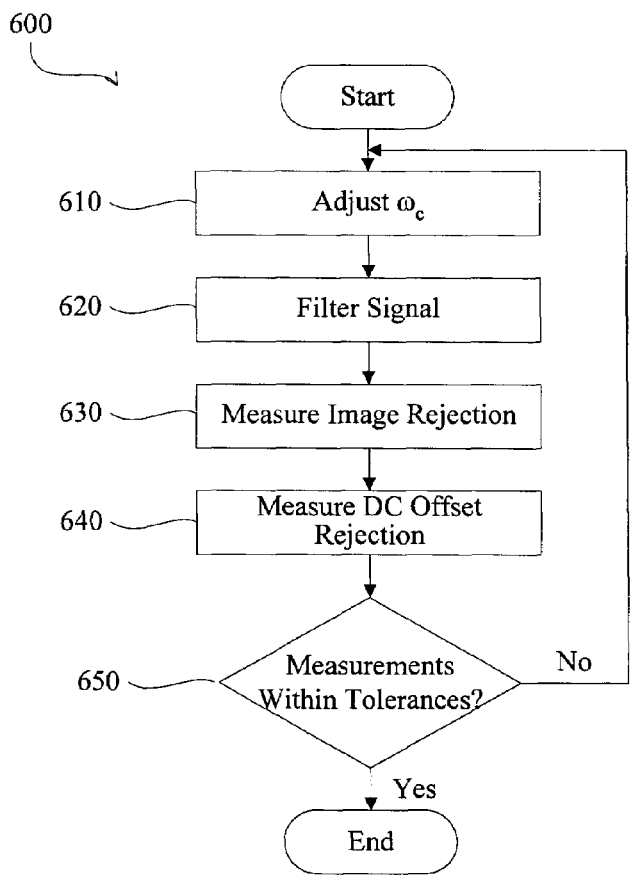
FIG. 6 is a flowchart illustrating a method for IF frequency selection according to an embodiment of the invention.

FIG. 6 is a flowchart illustrating a method 600 for IF frequency selection according to an embodiment of the invention. The IF receiver section 200 may implement the method 600. First, the IF center frequency is adjusted (610) by varying resistance of the resistors 410. A received signal is then filtered (620) using a bandpass filter using the adjusted frequency. Image rejection and DC offset rejection of the filtered signal is then measured (630, 640). It is then determined (650) if the measurements are within a specific tolerance (e.g., DC offset rejection is within acceptable tolerances and image rejection meet minimum pre-specified requirements). If the measurements are within the tolerances, the method 600 ends. Otherwise, the center frequency is then adjusted (610) again and the method 600 repeats.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
    filtering a signal with a bandpass filter;
    measuring image rejection and DC offset rejection of the filtered signal; and
    adjusting a center frequency of the bandpass filter,
    wherein the filtering, measuring and adjusting is repeated until a compromise between DC offset rejection and image rejection is achieved, and
    wherein the compromise is reached when the DC offset rejection is within acceptable tolerances and the image rejection meets minimum pre-specified requirements.

2. The method of claim 1, wherein the step of filtering comprises:
    filtering the signal with the bandpass filter comprising two cross-coupled low pass filters.

3. The method of claim 2, wherein the step of adjusting comprises:
    cross-coupling using cross-coupled variable resistors.

4. The method of claim 3, wherein the adjusting is done by varying the resistance of the cross-coupled variable resistors.

5. A system, comprising:
    means for filtering a signal;
    means for measuring image rejection and DC offset rejection of the filtered signal; and
    means for adjusting center frequency of the means for filtering,
    wherein the filtering, measuring, and adjusting is repeated until a compromise between DC offset rejection and image rejection is achieved, and
    wherein the compromise is reached when the DC offset rejection is within acceptable tolerances and the image rejection meets minimum pre-specified requirements.

6. A system, comprising:
    a bandpass filter configured to filter a received signal and to have a center frequency adjusted; and
    at least one measurement circuit, communicatively coupled to the filter, configured to measure image rejection and DC offset rejection of the filtered signal,
    wherein the bandpass filter and the at least one measurement circuit continue to filter, measure, and adjust the center frequency until a compromise between DC offset rejection and image rejection is achieved, and
    wherein the compromise is reached when the DC offset rejection is within acceptable tolerances and the image rejection meets minimum pre-specified requirements.

7. The system of claim 6, wherein the bandpass filter comprises:
    two cross-coupled low pass filters.

8. The system of claim 7, wherein the cross-coupling includes cross-coupled variable resistors.

9. The system of claim 8, wherein the adjusting is done by varying the resistance of the cross-coupled variable resistors.

* * * * *

UNITED STATES PATENT AND TRADEMARK OFFICE
CERTIFICATE OF CORRECTION

PATENT NO.        : 7,603,098 B2                        Page 1 of 1
APPLICATION NO. : 10/813270
DATED             : October 13, 2009
INVENTOR(S)       : Meng-An Pan It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1235 days.

Signed and Sealed this

Fourteenth Day of December, 2010

David J. Kappos
*Director of the United States Patent and Trademark Office*